United States Patent
Pandev

(10) Patent No.: US 10,502,549 B2
(45) Date of Patent: Dec. 10, 2019

(54) MODEL-BASED SINGLE PARAMETER MEASUREMENT

(71) Applicant: KLA-Tencor Corporation, Milpitas, CA (US)

(72) Inventor: Stilian Ivanov Pandev, Santa Clara, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 488 days.

(21) Appl. No.: 15/076,530

(22) Filed: Mar. 21, 2016

(65) Prior Publication Data

US 2016/0282105 A1    Sep. 29, 2016

Related U.S. Application Data

(60) Provisional application No. 62/137,225, filed on Mar. 24, 2015.

(51) Int. Cl.
| | |
|---|---|
| *G01B 11/06* | (2006.01) |
| *G01B 11/24* | (2006.01) |
| *H01L 21/66* | (2006.01) |

(52) U.S. Cl.
CPC .......... *G01B 11/0616* (2013.01); *G01B 11/24* (2013.01); *H01L 22/12* (2013.01); *G01B 2210/56* (2013.01)

(58) Field of Classification Search
CPC ............... G01B 11/0616; G01B 11/24; G01B 2210/56; H01L 22/12
See application file for complete search history.

(56) References Cited

U.S. PATENT DOCUMENTS

| | | |
|---|---|---|
| 5,608,526 A | 3/1997 | Piwonka-Corle et al. |
| 5,859,424 A | 1/1999 | Norton et al. |

(Continued)

OTHER PUBLICATIONS

International Search Report dated Jun. 24, 2016, for PCT Application No. PCT/US2016/023832 filed on Mar. 23, 2016 by KLA-Tencor Corporation, 3 pages.

*Primary Examiner* — Peniel M Gumedzoe
(74) *Attorney, Agent, or Firm* — Spano Law Group; Joseph S. Spano

(57) ABSTRACT

Methods and systems for building and using a parameter isolation model to isolate measurement signal information associated with a parameter of interest from measurement signal information associated with incidental model parameters are presented herein. The parameter isolation model is trained by mapping measurement signals associated with a first set of instances of a metrology target having known values of a plurality of incidental model parameters and known values of a parameter of interest to measurement signals associated with a second set of instances of the metrology target having nominal values of the plurality of incidental model parameters and the known values of the parameter of interest. The trained parameter isolation model receives raw measurement signals and isolates measurement signal information associated with a specific parameter of interest for model-based parameter estimation. The number of floating parameters of the measurement model is reduced, resulting in a significant reduction of computational effort.

19 Claims, 9 Drawing Sheets

(56) References Cited

U.S. PATENT DOCUMENTS

| | | | |
|---|---|---|---|
| 5,963,329 A * | 10/1999 | Conrad | G01B 11/02 |
| | | | 356/601 |
| 6,429,943 B1 | 8/2002 | Opsal et al. | |
| 6,633,831 B2 | 10/2003 | Nikoonahad et al. | |
| 6,734,967 B1 | 5/2004 | Piwonka-Corle et al. | |
| 6,816,570 B2 | 10/2004 | Janik et al. | |
| 6,895,075 B2 | 5/2005 | Yokhin et al. | |
| 6,972,852 B2 | 12/2005 | Opsal et al. | |
| 7,478,019 B2 | 1/2009 | Zangooie et al. | |
| 7,826,071 B2 | 11/2010 | Shchegrov et al. | |
| 7,929,667 B1 | 4/2011 | Zhuang et al. | |
| 7,933,026 B2 | 4/2011 | Opsal et al. | |
| 8,843,875 B2 | 9/2014 | Pandev | |
| 2005/0192914 A1 | 9/2005 | Drege et al. | |
| 2007/0229854 A1 | 10/2007 | Wu et al. | |
| 2009/0094005 A1 | 4/2009 | Den Boef et al. | |
| 2013/0114085 A1 | 5/2013 | Wang et al. | |
| 2014/0111791 A1 | 4/2014 | Manassen et al. | |
| 2014/0172394 A1 | 6/2014 | Kuznetsov et al. | |
| 2014/0222380 A1 | 8/2014 | Kuznetsov et al. | |
| 2014/0297211 A1 | 10/2014 | Pandev et al. | |
| 2014/0316730 A1 | 10/2014 | Shchegrov et al. | |
| 2015/0042984 A1 | 2/2015 | Pandev et al. | |
| 2015/0046118 A1 | 2/2015 | Pandev et al. | |
| 2015/0058813 A1 | 2/2015 | Kim et al. | |

\* cited by examiner

MODEL-BASED SINGLE PARAMETER MEASUREMENT

CROSS REFERENCE TO RELATED APPLICATION

The present application for patent claims priority under 35 U.S.C. § 119 from U.S. provisional patent application Ser. No. 62/137,225, entitled "Model-Based Single Parameter Measurement," filed Mar. 24, 2015, the subject matter of which is incorporated herein by reference in its entirety.

TECHNICAL FIELD

The described embodiments relate to metrology systems and methods, and more particularly to methods and systems for improved measurement of structures fabricated in the semiconductor industry.

BACKGROUND INFORMATION

Semiconductor devices such as logic and memory devices are typically fabricated by a sequence of processing steps applied to a specimen. The various features and multiple structural levels of the semiconductor devices are formed by these processing steps. For example, lithography among others is one semiconductor fabrication process that involves generating a pattern on a semiconductor wafer. Additional examples of semiconductor fabrication processes include, but are not limited to, chemical-mechanical polishing, etch, deposition, and ion implantation. Multiple semiconductor devices may be fabricated on a single semiconductor wafer and then separated into individual semiconductor devices.

Metrology processes are used at various steps during a semiconductor manufacturing process to detect defects on wafers to promote higher yield. Model-based metrology techniques offer the potential for high throughput without the risk of sample destruction. A number of model-based metrology based techniques including scatterometry, ellipsometry, and reflectometry implementations and associated analysis algorithms are commonly used to characterize critical dimensions, film thicknesses, composition, overlay and other parameters of nanoscale structures.

Modern semiconductor processes are employed to produce complex structures. A complex measurement model with multiple parameters is required to represent these structures and account for process and dimensional variations. Complex, multiple parameter models include modeling errors induced by parameter correlations and low measurement sensitivity to some parameters. In addition, regression of complex, multiple parameter models having a relatively large number of floating parameter values may not be computationally tractable. To reduce the impact of these error sources and reduce computational effort, a number of parameters are typically fixed in a model-based measurement. Although fixing the values of a number of parameters may improve calculation speed and reduce the impact of parameter correlations, it also leads to errors in the estimates of parameter values.

Currently, the solution of complex, multiple parameter measurement models often requires an unsatisfactory compromise. Current model reduction techniques are sometimes unable to arrive at a measurement model that is both computationally tractable and sufficiently accurate. Moreover, complex, multiple parameter models make it difficult, or impossible, to optimize system parameter selections (e.g., wavelengths, angles of incidence, etc.) for each parameter of interest.

Future metrology applications present challenges due to increasingly small resolution requirements, multi-parameter correlation, increasingly complex geometric structures, and increasing use of opaque materials. Thus, methods and systems for improved measurements are desired.

SUMMARY

Methods and systems for building and using a parameter isolation model to isolate measurement signal information associated with a parameter of interest from measurement signal information associated with incidental model parameters are presented herein.

In one aspect, a parameter isolation model is trained by mapping measurement signals associated with a first set of instances of a metrology target to a second set of instances of the metrology target. The first set of instances of the metrology target includes known values of a plurality of incidental model parameters and known values of a parameter of interest. The second set of instances of the metrology target includes nominal values of the plurality of incidental model parameters and the same, known values of the parameter of interest. The incidental parameters are model parameters that are required to formulate a measurement model, but are not directly indicative of a property of interest of the specimen under measurement.

A trained parameter isolation model receives raw measurement signals and removes signal information related to the incidental parameters. The output signals generated by the trained parameter isolation model include signal information associated with one or more parameters of interest. However, the output signals are not sensitive to changes in values of the incidental parameters because signal information associated by the incidental parameter has been stripped away by the trained parameter isolation model. Consequently, the values of the incidental parameters can be assigned a fixed value during the model solution process (e.g., measurement model regression). As a result, the degrees of freedom of the measurement model (e.g., floating parameters) are reduced during the model solution process. In some embodiments, only the parameters of interest are floated during regression of the measurement model. This dramatically reduces the amount of computational effort required to generate estimates for the one or more parameters of interest.

In a further aspect, a parameter isolation model is trained and utilized to measure each parameter of interest individually. Thus, the parameter isolation model associated with each parameter of interest is optimized independently. By selecting each parameter of interest individually, the computational burden associated with parameter isolation model training is reduced and the performance of the underlying measurement can be maximized by selecting different wavelengths, measurement subsystems, and measurement methods that are optimized for each individual parameter. In addition, different model-based measurement solvers can be selected, or configured differently, for each parameter of interest.

In another further aspect, a parameter isolation model is trained and utilized to measure multiple parameters of interest in parallel. Thus, a single parameter isolation model is trained to isolate signals associated multiple parameters of interest. In one example, reference raw measurement data may be collected for a number of different parameters and multiple parameters may be selected as parameters of interest, while the remaining parameters are treated as incidental parameters for purposes of training a parameter isolation model associated with the multiple parameters of interest.

In another aspect, the parameter isolation model uses the entire set of raw measurement data collected from a number of measurement sites across the wafer, or a subset of the wafer, for both training and subsequent measurement at each individual measurement site. As a result the parameter isolation model captures parameter variations across the wafer, including random process and measurement errors. For example, processes change randomly (e.g., random focus and dosage errors, etc.) and the parameter isolation models described herein are able to capture these errors.

The foregoing is a summary and thus contains, by necessity, simplifications, generalizations and omissions of detail; consequently, those skilled in the art will appreciate that the summary is illustrative only and is not limiting in any way. Other aspects, inventive features, and advantages of the devices and/or processes described herein will become apparent in the non-limiting detailed description set forth herein.

DETAILED DESCRIPTION

Reference will now be made in detail to background examples and some embodiments of the invention, examples of which are illustrated in the accompanying drawings.

Methods and systems for building and using a parameter isolation model to isolate measurement signal information associated with a parameter of interest from measurement signal information associated with other model parameters are presented herein. By isolating measurement signal information associated with a specific parameter of interest, the complexity and the number of floating parameters of a measurement model applied to the measurement signals can be reduced without sacrificing measurement accuracy. Thus, sufficiently accurate model-based measurement results can be obtained with dramatically reduced computational effort.

A trained parameter isolation model receives raw measurement signals and removes signal information related to specific, incidental parameters. The incidental parameters are model parameters that are required to formulate a measurement model, but are not directly indicative of a property of interest of the specimen under measurement. The output signals generated by the trained parameter isolation model include signal information associated with one or more parameters of interest. Consequently, the output signals generated by the trained parameter isolation model are not sensitive to incidental parameters, and these parameters can be assigned a fixed value during the model solution process (e.g., measurement model regression). As a result, the degrees of freedom of the measurement model (e.g., floating parameters) are reduced during the model solution process. In some embodiments, only the parameters of interest are floated during regression of the measurement model. This dramatically reduces the amount of computational effort required to generate estimates for the one or more parameters of interest.

Figure 1:
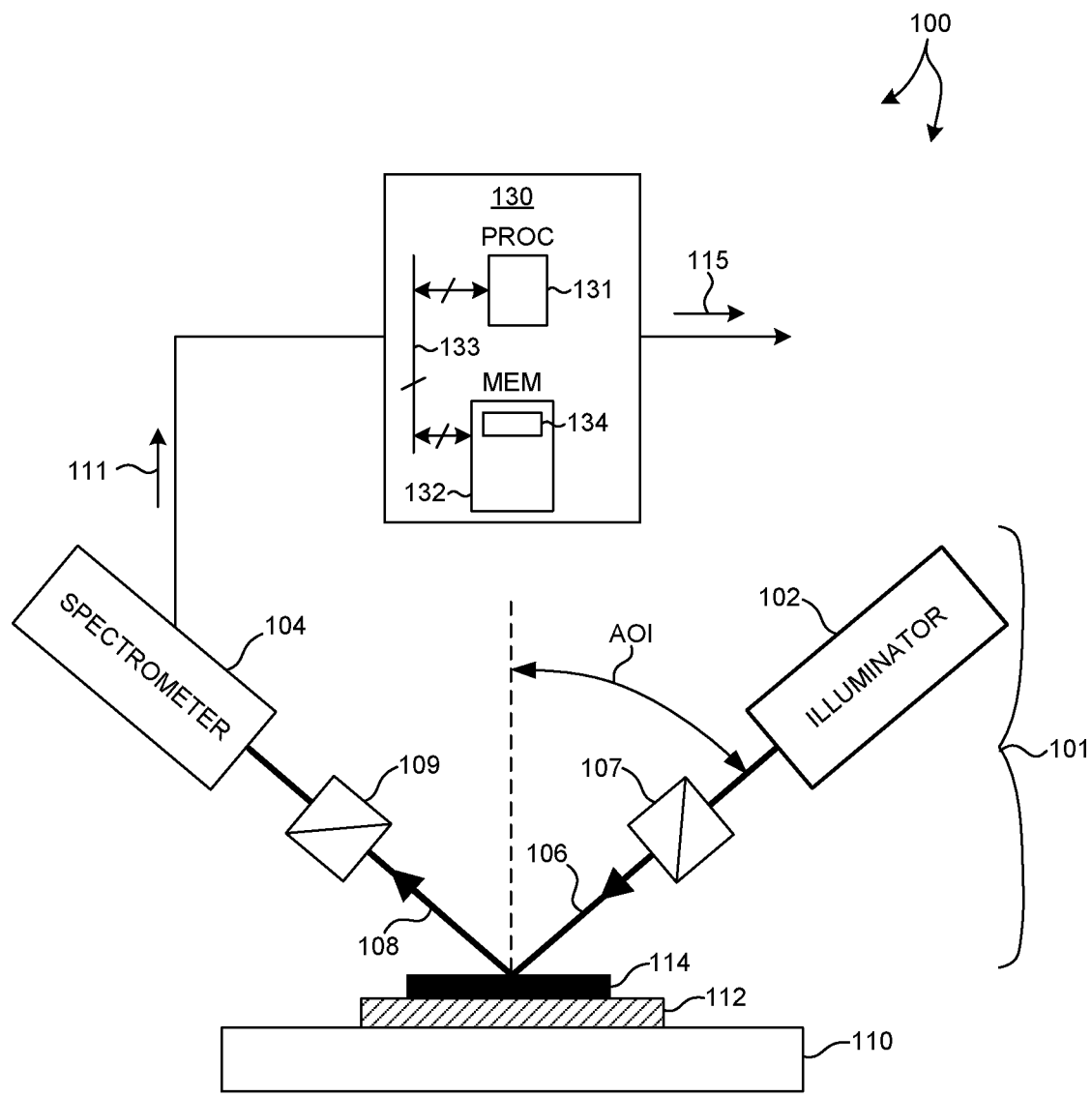
FIG. 1 depicts a measurement system 100 for measuring characteristics of a semiconductor wafer in accordance with the methods described herein.

FIG. 1 illustrates a system 100 for measuring characteristics of a semiconductor wafer. As shown in FIG. 1, the system 100 may be used to perform spectroscopic ellipsometry measurements of one or more structures 114 of a semiconductor wafer 112 disposed on a wafer positioning system 110. In this aspect, the system 100 may include a spectroscopic ellipsometer 101 equipped with an illuminator 102 and a spectrometer 104. The illuminator 102 of the system 100 is configured to generate and direct illumination of a selected wavelength range (e.g., 150-1700 nm) to the structure 114 disposed on the surface of the semiconductor wafer 112. In turn, the spectrometer 104 is configured to receive light from the surface of the semiconductor wafer 112. It is further noted that the light emerging from the illuminator 102 is polarized using a polarization state generator 107 to produce a polarized illumination beam 106. The radiation reflected by the structure 114 disposed on the wafer 112 is passed through a polarization state analyzer 109 and to the spectrometer 104. The radiation received by the spectrometer 104 in the collection beam 108 is analyzed with regard to polarization state, allowing for spectral analysis of radiation passed by the analyzer. These spectra 111 are passed to the computing system 130 for analysis of the structure 114.

In a further embodiment, the metrology system 100 is a measurement system 100 that includes one or more computing systems 130 configured to execute a parameter isolation model (PIM) building tool and a PIM measurement tool in accordance with the description provided herein. In the preferred embodiment, the PIM building and measurement tools are a set of program instructions 134 stored in a memory 132. The program instructions 134 are read and executed by one or more processors of computing system 130 to realize PIM functionality as described herein. Computing system 130 may be communicatively coupled to the spectrometer 104. In one aspect, computing system 130 is configured to receive measurement data 111 associated with a measurement (e.g., critical dimension, film thickness, composition, process, etc.) of the structure 114 of specimen 112. In one example, the measurement data 111 includes an indication of the measured spectral response of the specimen by measurement system 100 based on the one or more sampling processes from the spectrometer 104. In some embodiments, computing system 130 is further configured to determine specimen parameter values of structure 114 from measurement data 111. In one example, the computing system 130 is configured to access model parameters in real-time, employing Real Time Critical Dimensioning (RTCD), or it may access libraries of pre-computed models for determining a value of at least one parameter of interest associated with the target structure 114.

In some embodiments, measurement system 100 is further configured to store one or more trained parameter isolation models 115 in a memory (e.g., memory 132 or an external memory).

It should be recognized that the various steps described throughout the present disclosure may be carried out by a single computer system 130 or, alternatively, a multiple computer system 130. Moreover, different subsystems of the system 100, such as the spectroscopic ellipsometer 101, may include a computer system suitable for carrying out at least a portion of the steps described herein. Therefore, the aforementioned description should not be interpreted as a limitation on the present invention but merely an illustration. Further, computing system 130 may be configured to perform any other step(s) of any of the method embodiments described herein.

The computing system 130 may include, but is not limited to, a personal computer system, mainframe computer system, workstation, image computer, parallel processor, or any other device known in the art. In general, the term "computing system" may be broadly defined to encompass any device having one or more processors, which execute instructions from a memory medium. In general, computing system 130 may be integrated with a measurement system such as measurement system 100, or alternatively, may be separate from any measurement system. In this sense, computing system 130 may be remotely located and receive measurement data from any measurement source.

Program instructions 134 implementing methods such as those described herein may be transmitted over a transmission medium such as a wire, cable, or wireless transmission link. Memory 132 storing program instructions 134 may include a computer-readable medium such as a read-only memory, a random access memory, a magnetic or optical disk, or a magnetic tape.

In addition, the computer system 130 may be communicatively coupled to the spectrometer 104 or the illuminator subsystem 102 of the ellipsometer 101 in any manner known in the art.

The computing system 130 may be configured to receive and/or acquire data or information from subsystems of the system (e.g., spectrometer 104, illuminator 102, and the like) by a transmission medium that may include wireline and/or wireless portions. In this manner, the transmission medium may serve as a data link between the computer system 130 and other subsystems of the system 100. Further, the computing system 130 may be configured to receive measurement data via a storage medium (i.e., memory). For instance, the spectral results obtained using a spectrometer of ellipsometer 101 may be stored in a permanent or semi-permanent memory device (not shown). In this regard, the spectral results may be imported from an external system. Moreover, the computer system 130 may send data to external systems via a transmission medium.

The embodiments of the system 100 illustrated in FIG. 1 may be further configured as described herein. In addition, the system 100 may be configured to perform any other block(s) of any of the method embodiment(s) described herein.

In general, ellipsometry is an indirect method of measuring physical properties of the specimen under inspection. In most cases, the raw measurement signals (e.g., $\alpha_{meas}$ and $\beta_{meas}$) cannot be used to directly determine the physical properties of the specimen. The nominal measurement process consists of parameterization of the structure (e.g., film thicknesses, critical dimensions, etc.) and the machine (e.g., wavelengths, angles of incidence, polarization angles, etc.). A measurement model is created that attempts to predict the measured values (e.g., $\alpha_{meas}$ and $\beta_{meas}$). As illustrated in equations (1) and (2), the model includes parameters associated with the machine ($P_{machine}$) and the specimen ($P_{specimen}$).

$$\alpha_{model} = f(P_{machine}, P_{specimen}) \quad (1)$$

$$\beta_{model} = g(P_{machined}, P_{specimen}) \quad (2)$$

Machine parameters are parameters used to characterize the metrology tool (e.g., ellipsometer 101). Exemplary machine parameters include angle of incidence (AOI), analyzer angle ($A_0$), polarizer angle ($P_0$), illumination wavelength, numerical aperture (NA), etc. Specimen parameters are parameters used to characterize the specimen (e.g., specimen 112 including structures 114). For a thin film specimen, exemplary specimen parameters include refractive index, dielectric function tensor, nominal layer thickness of all layers, layer sequence, etc. For measurement purposes, the machine parameters are treated as known, fixed parameters and one or more of the specimen parameters are treated as unknown, floating parameters.

In some examples, the floating parameters are resolved by an iterative process (e.g., regression) that produces the best fit between theoretical predictions and experimental data. The unknown specimen parameters, $P_{specimen}$, are varied and the model output values (e.g., $\alpha_{model}$ and $\beta_{model}$) are calculated until a set of specimen parameter values are determined that results in a close match between the model output values and the experimentally measured values (e.g., $\alpha_{meas}$ and $\beta_{meas}$). In a model based measurement application such as spectroscopic ellipsometry on a CD specimen, a regression process (e.g., ordinary least squares regression) is employed to identify specimen parameter values that minimize the differences between the model output values and the experimentally measured values for a fixed set of machine parameter values.

In some examples, the floating parameters are resolved by a search through a library of pre-computed solutions to find the closest match. In a model based measurement application such as spectroscopic ellipsometry on a CD specimen, a library search process is employed to identify specimen parameter values that minimize the differences between pre-computed output values and the experimentally measured values for a fixed set of machine parameter values.

In a model-based measurement application, simplifying assumptions often are required to maintain sufficient throughput. In some examples, the truncation order of a Rigorous Coupled Wave Analysis (RCWA) must be reduced to minimize compute time. In another example, the number or complexity of library functions is reduced to minimize search time. In another example, the number of floating parameters is reduced. If not performed carefully, these simplifying assumptions may lead to unacceptable errors in the estimation of values of one or more parameters of interest. By building and using a parameter isolation model to isolate measurement signal information associated with parameter of interest as described herein, the model-based measurement can be simplified without sacrificing measurement accuracy.

Figure 2:
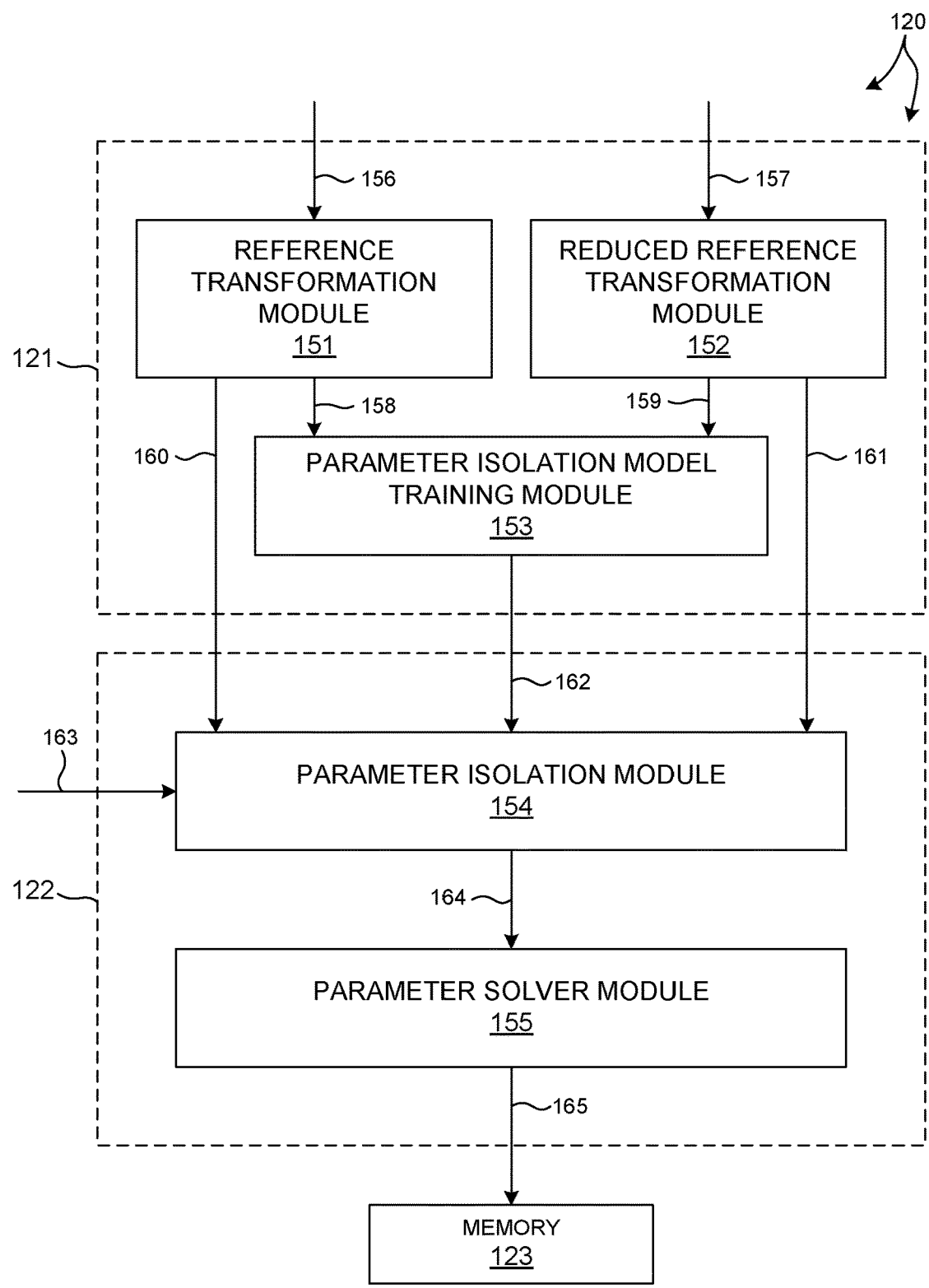
FIG. 2 is a diagram 120 illustrative of an exemplary PIM building tool 121 and a PIM measurement tool 122.

FIG. 2 is a diagram 120 illustrative of an exemplary PIM building tool 121 and a PIM measurement tool 122 implemented by computing system 130. In the embodiment depicted in FIG. 2, computing system 130 is configured to implement PIM building and measurement functionality as described herein.

FIG. 2 is a diagram 120 illustrative of an exemplary PIM building tool 121 and a PIM measurement tool 122 implemented by computing system 130. In the embodiment depicted in FIG. 2, computing system 130 is configured to implement PIM building and measurement functionality as described herein.

In the embodiment depicted in FIG. 2, reference measurement signals 156 are received by reference transformation module 151. Reference measurement signals 156 are raw measurement signals associated with measurements of one or more metrology targets having a known range of values of a plurality of incidental model parameters and a known range of values of at least one parameter of interest. Raw measurement signals are measurement signals generated by a measurement system, such as ellipsometer 101 depicted in FIG. 1. In a model-based measurement, a regression process, library search, or some combination thereof, is employed to estimate model parameter values that best match the raw measurement signals to corresponding signal values predicted by the measurement model.

Similarly, reduced reference measurement signals 157 are received by reduced reference transformation module 152. The reduced reference measurement signals 157 are associated with measurements of the same metrology targets, or different instances of the same metrology targets, as reference measurement signals 156. However, the metrology targets measured to obtain reduced reference measurement signals 157 have a known, nominal value for each of the plurality of incidental model parameters and the same, known values of the one or more parameters of interest.

In a preferred embodiment, reference measurement signals 156 and reduced reference measurement signals 157 are generated by simulating the measurement signals generated by a measurement system, such as ellipsometer 101 depicted in FIG. 1, for each specific measurement application under consideration. Each specific measurement application defines the metrology target(s), measurement system configuration, and measurement model under consideration. The measurement model is simulated with the known parameter values, and the simulated measurement signals are treated as the reference measurement signals 156 and reduced reference measurement signals provided to PIM building tool 121.

In some other embodiments, reference measurement signals 156, reduced reference measurement signals 157, or both, are actual, raw measurement signals generated by actual measurements of the metrology targets having the known parameter values under consideration by the measurement system. In these embodiments, the signals generated by actual measurements are treated as the reference measurement signals 156 and reduced reference measurement signals 157 provided to PIM building tool 121.

Figure 3:
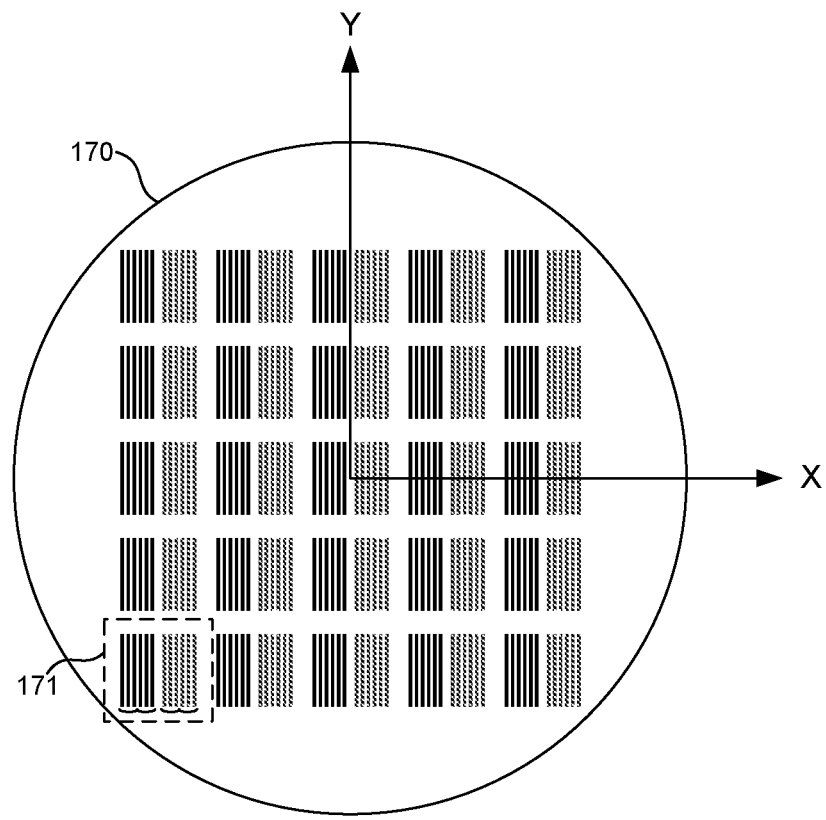
FIG. 3 depicts a wafer 170 having a grid of measurement sites 171.

FIG. 3 depicts a wafer 170 having a grid of measurement sites 171. Each measurement site includes one or more metrology targets measured by a measurement system (e.g., metrology system 100 depicted in FIG. 1). In general, measurement data collection may be performed across the entire wafer or a subset of the wafer area. In addition, in some embodiments, the metrology targets are designed for printability and sensitivity to changes in process parameters, structural parameters of interest, or both. In some examples, the metrology targets are specialized targets. In some embodiments, the metrology targets are based on conventional line/space targets. By way of non-limiting example, CD targets, SCOL targets, or AiM™ targets available from KLA-Tencor Corporation, Milpitas, Calif. (USA) may be employed. In some other embodiments, the metrology targets are device-like structures. In some other examples, the metrology targets are device structures, or portions of device structures. Regardless of the type of metrology target employed, a set of metrology targets that exhibit sensitivity to the process variations, structural variations, or both, being explored is provided for measurements performed using a trained parameter isolation model. Once the model is trained, it may be used to perform measurements of different instances of the same metrology targets, albeit with unknown values of one or more parameters of interest.

Reference transformation module 151 transforms reference measurement signals 156 into a set of reference signal components 158 using an input signal transformation model 160. Similarly, reference transformation module 152 transforms reduced reference measurement signals 157 into a set of reduced reference signal components 159 using a reference signal transformation model.

In some embodiments, the input signal transformation model 160 and the reference signal transformation model are linear transformations. In some of these embodiments, the linear transformations are determined based on a principle components analysis. In some embodiments, the input signal transformation model 160 and the reference signal transformation model are non-linear transformations. In some of these embodiments, a non-linear model is trained in an iterative manner based on the known parameter values and signals 156 and 157 to arrive at sufficiently small sets of signal components.

The transformation of signals 156 and 157 into signal components is performed to reduce the dimension of the training data under consideration. In this sense, these transformations are optional. Hence, in some embodiments, signals 156 and 157 are received directly by PIM training module 153, although this is not preferred.

In addition to transforming reduced reference measurement signals 157 into a set of reduced reference signal components 159, reference transformation module 152 also generates an inverse transformation model 161 that transforms signal components 159 back into signals 157 with a minimal error.

PIM training module 153 receives signal components 158 and 159 from reference transformation module 151 and reduced reference transformation module 152, respectively.

PIM training module 153 trains a parameter isolation model 162 based on the received signal components. The training of the parameter isolation model 162 is based on mapping signal components 158 to the signal components 159. Equation (3) illustrates an exemplary mapping, M, of reference signal components 158 to reduced reference signal components 159.

$$SC_{reduced}^{ref} = M(SC^{ref}) \quad (3)$$

The trained parameter isolation model 162 defines a functional relationship between reference signal components 158 and reduced reference signal components 159. In more general terms, the trained parameter isolation model 162 defines a mapping from raw measurement signals based on measurements of targets with a range of values of incidental parameters and one or more parameters of interest to reduced raw measurement signals based on measurements of targets with fixed values of incidental parameters and a range of values of one or more parameters of interest. In some examples, the parameter isolation model 162 is implemented as a neural network model. In other examples, the parameter isolation model 162 may be implemented as a linear model, a non-linear model, a polynomial model, a response surface model, a support vector machines model, or other types of models. In some examples, the parameter isolation model 162 may be implemented as a combination of models. By augmenting model-based metrology with a trained parameter isolation model 162, overall measurement accuracy and precision are improved, while computational effort is dramatically reduced.

By using raw measurement data, or components of the raw measurement data, to train the parameter isolation model 162, errors and approximations associated with traditional measurement model reduction techniques are reduced. In addition, the parameter isolation model 162 is not sensitive to systematic errors, asymmetries, etc. because the parameter isolation model 162 is trained based on raw measurement data associated with a particular measurement application and used to perform measurements based on the same measurement application. It should be noted that systematic errors that are embedded in the raw measurement data utilized for training the parameter isolation model 162 will not be captured by the trained parameter isolation model 162. Thus, it is important to select a measurement system with systematic errors that are within acceptable limits for the particular measurement application under consideration.

In summary, input signal transformation model 160, inverse transformation model 161, and trained parameter isolation model 162 are communicated as output from PIM building tool 121. In some embodiments, these elements are stored in a memory (e.g., memory 132 or an external memory) for future use. In some embodiments, these elements are received by PIM measurement tool 122 for use in actual measurements.

As depicted in FIG. 2, parameter isolation module 154 receives input signal transformation model 160, inverse transformation model 161, and trained parameter isolation model 162. In addition, parameter isolation module 154 receives raw measurement signals 163. Raw measurement signals 163 are generated by actual measurements of structures having unknown values of both incidental parameters and parameters of interest. The measured structures are different instances of the same structures measured to generate reference measurement signals 156 and reduced reference measurement signals 157. In this sense, the measurement application associated with signals 163 is the same measurement application associated with signals 156 and 157.

Parameter isolation module 154 transforms raw measurement signals 163, $S^{meas}$, into a set of measured signal components, $SC^{meas}$, using input signal transformation model 160. Equation (4) illustrates the input signal transformation, $T^{ref}$, operating on raw measurement signals, $S^{meas}$, to arrive at the measured signal components, $SC^{meas}$.

$$SC^{meas} = T^{ref}(S^{meas}) \quad (4)$$

Parameter isolation module 154 maps the measured signal components, $SC^{meas}$, to reduced, measured signal components, $SC_{red}^{meas}$, using parameter isolation model 162. Equation (5) illustrates parameter isolation model, M, operating on measured signal components, $SC^{meas}$, to arrive at the reduced, measured signal components, $SC_{red}^{meas}$.

$$SC_{read}^{meas} = M(SC^{meas}) \quad (5)$$

In addition, parameter isolation module 154 transforms the reduced, measured signal components, $SC_{red}^{meas}$, into a set of reduced, measured signals, $S_{red}^{meas}$, using inverse transformation model 161. Equation (6) illustrates the inverse signal transformation, $T_{ref}^{-1}$, operating on reduced, measured signal components, $SC_{red}^{meas}$, to arrive at the reduced, measured signals, $S_{red}^{meas}$.

$$S_{red}^{meas} = T_{ref}^{-1}(SC_{red}^{meas}) \quad (6)$$

The reduced, measured signals 164 are communicated to parameter solver module 155. Parameter solver module 155 estimates values of one or more parameters of interest 165 based on the reduced, measured signals 164. The incidental parameters of the measurement model employed by parameter solver module 155 are fixed to the nominal values associated with the reduced reference measurement signals 157 employed to train the parameter isolation model, M, and the one or more parameters of interest are floated. By way of non-limiting example, parameter solver module 155 may employ model-based regression, model-based library search, model-based library regression, signal response metrology, or any combination thereof. Further details regarding signal response metrology are discussed in U.S. Patent Publication No. 2014/0297211 and U.S. Patent Publication No. 2014/0316730, the contents of which are incorporated herein by reference in their entireties.

In the embodiment depicted in FIG. 2, the estimated values 165 of the one or more parameters of interest are stored in a memory (e.g., memory 123).

In the embodiment depicted in FIG. 1, a spectroscopic ellipsometer 101 provides measurement data for training and using a parameter isolation model. However, in general, any suitable model-based metrology technique may be employed to generate measurement data for training and use of a parameter isolation model in accordance with the methods described herein.

In one example, a parameter isolation model is trained based on pupil image data in a scatterometry overlay measurement application.

In another example, a parameter isolation model is trained based on image data in an image-based overlay measurement application. In this example, raw image data includes process induced asymmetries such as sidewall angle in addition to the asymmetry introduced by overlay offset. The parameter isolation model is trained to isolate the incidental asymmetries (e.g., sidewall angle) from the asymmetry due to the parameter of interest (e.g., overlay offset). This is achieved by training the parameter isolation model based on simulated reference signals and simulated reduced reference signals. The reference signals include a range of values of the incidental parameters (e.g., sidewall angle) and a range of values of the parameter of interest (e.g., overlay offset). The reduced reference signals include a nominal value for each incidental parameter and the same range of values of the parameter of interest. The trained parameter isolation model is employed to reduce the image data collected from samples having unknown overlay. The reduced image data is not sensitive to process induced asymmetries. An image-based overlay algorithm is employed to estimate the overlay offset based on the reduced image data.

Figure 4:
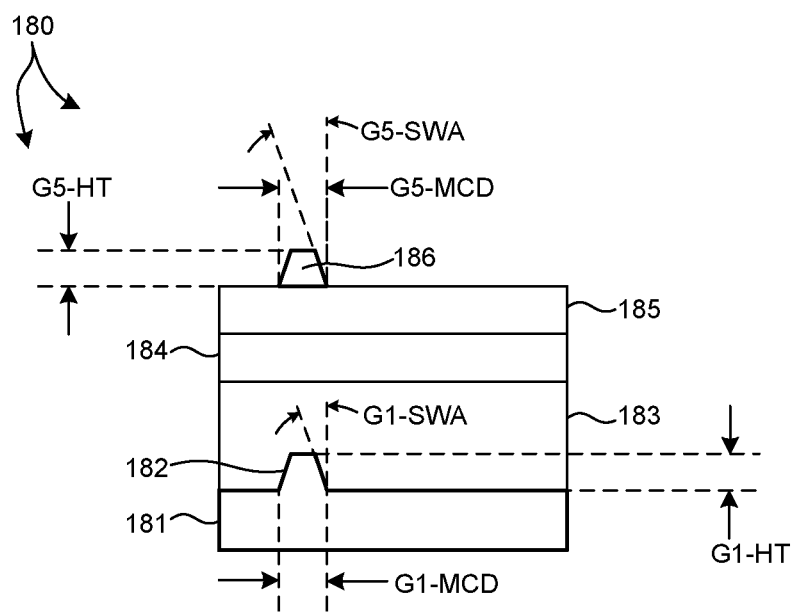
FIG. 4 depicts a structure 180 under measurement, for example, by metrology system 100.
Figure 5:
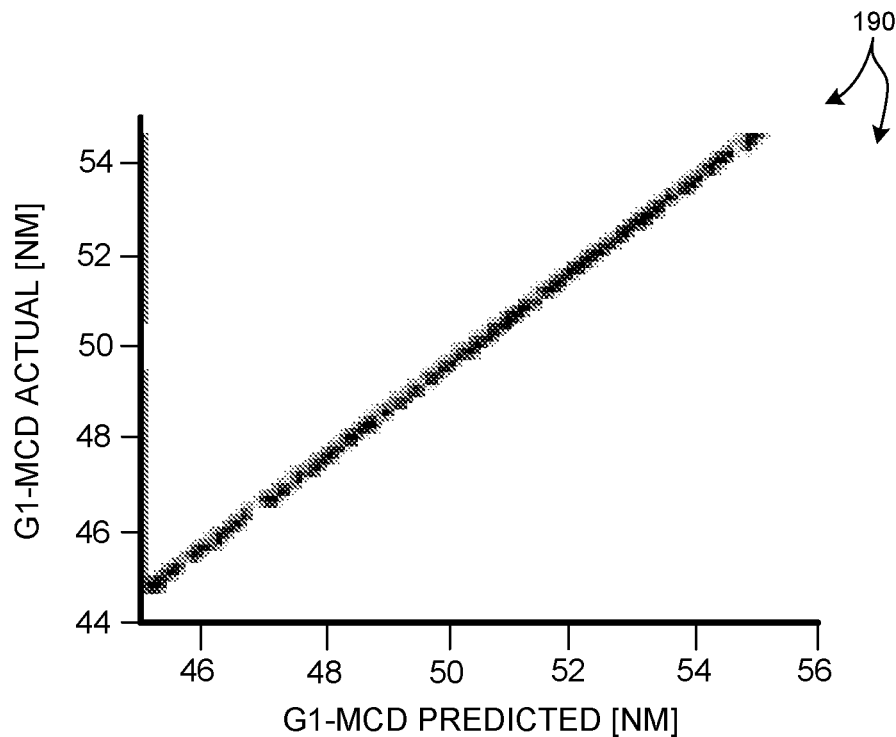
FIG. 5 illustrates a plot 190 depicting a simulation of the tracking performance of parameter, G1-MCD, depicted in FIG. 4, based on conventional model-based measurement.
Figure 6:
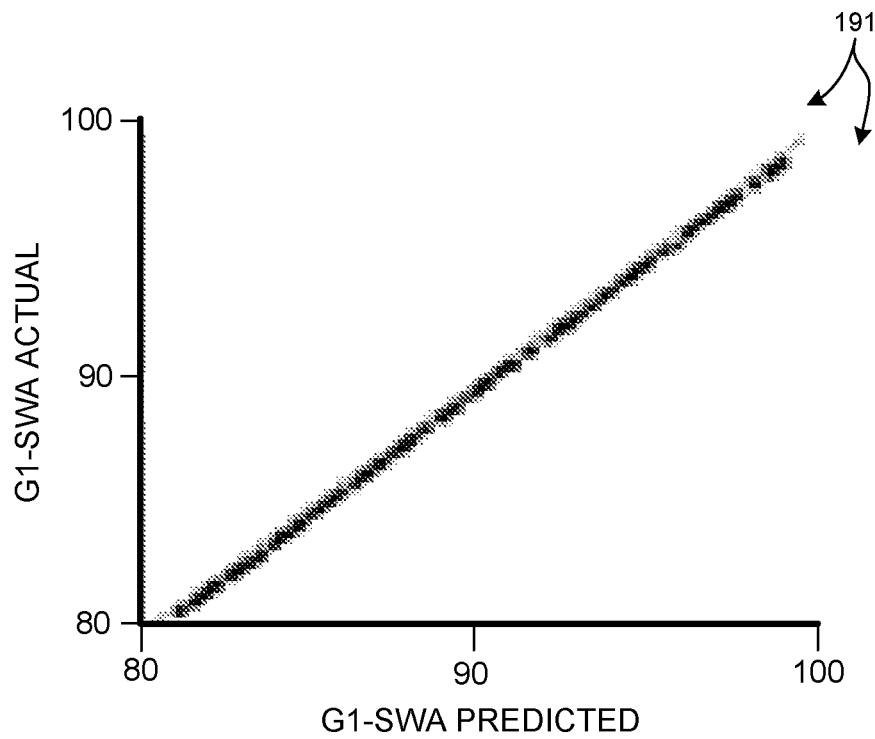
FIG. 6 illustrates a plot 191 depicting a simulation of the tracking performance of parameter, G1-SWA, depicted in FIG. 4, based on conventional model-based measurement.
Figure 7:
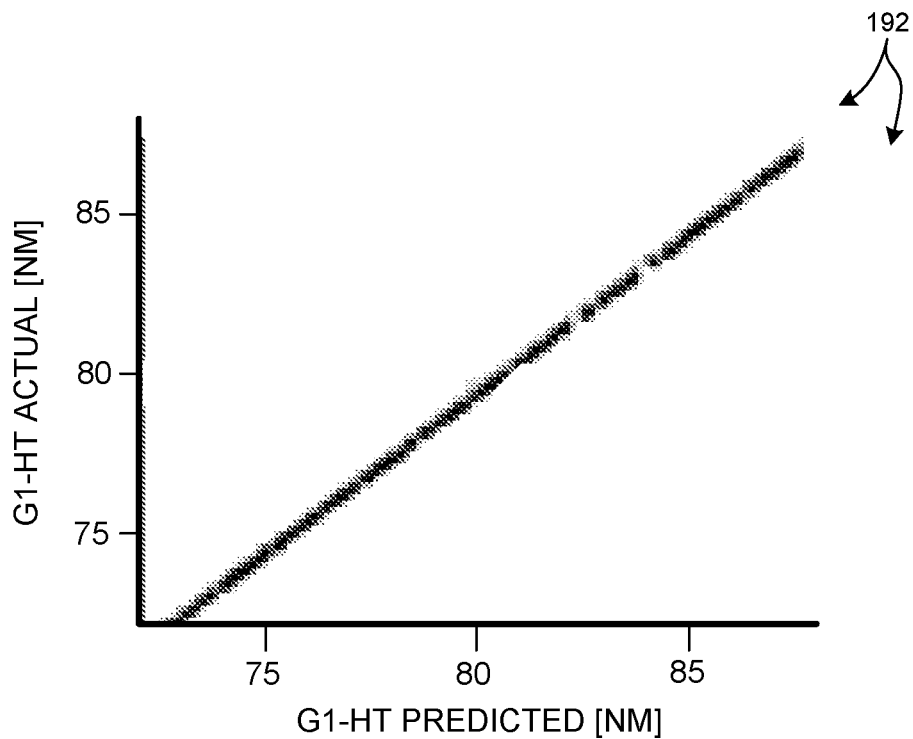
FIG. 7 illustrates a plot 192 depicting a simulation of the tracking performance of parameter, G1-HT, depicted in FIG. 4, based on conventional model-based measurement.
Figure 8:
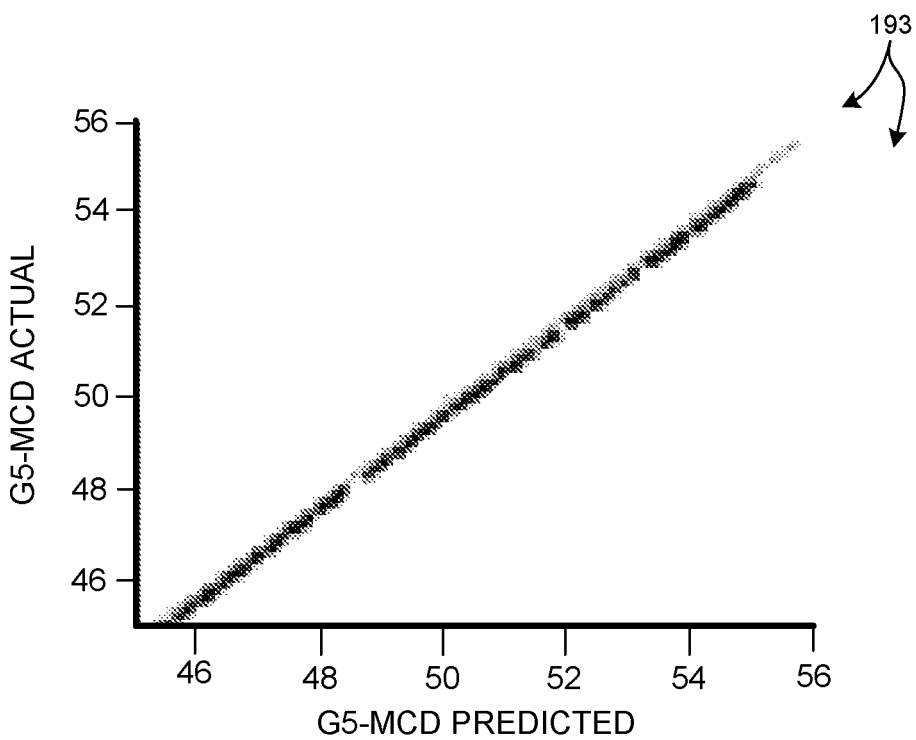
FIG. 8 illustrates a plot 193 depicting a simulation of the tracking performance of parameter, G5-MCD, depicted in FIG. 4, based on conventional model-based measurement.
Figure 9:
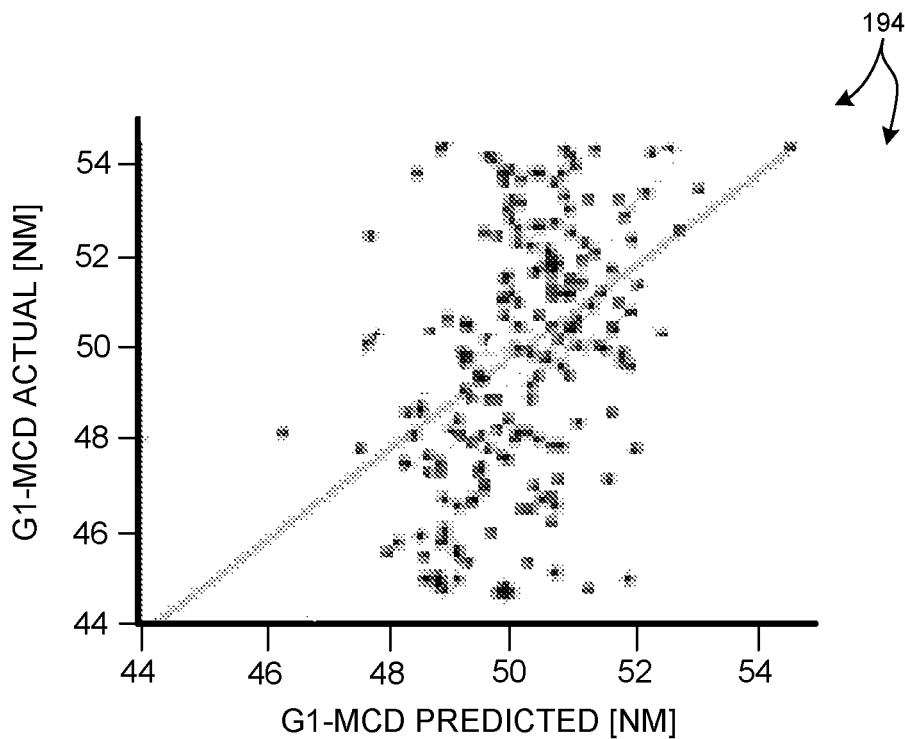
FIG. 9 illustrates a plot 194 depicting a simulation of the tracking performance of parameter, G1-MCD, depicted in FIG. 4, based on model-based measurement using a trained parameter isolation model.
Figure 10:
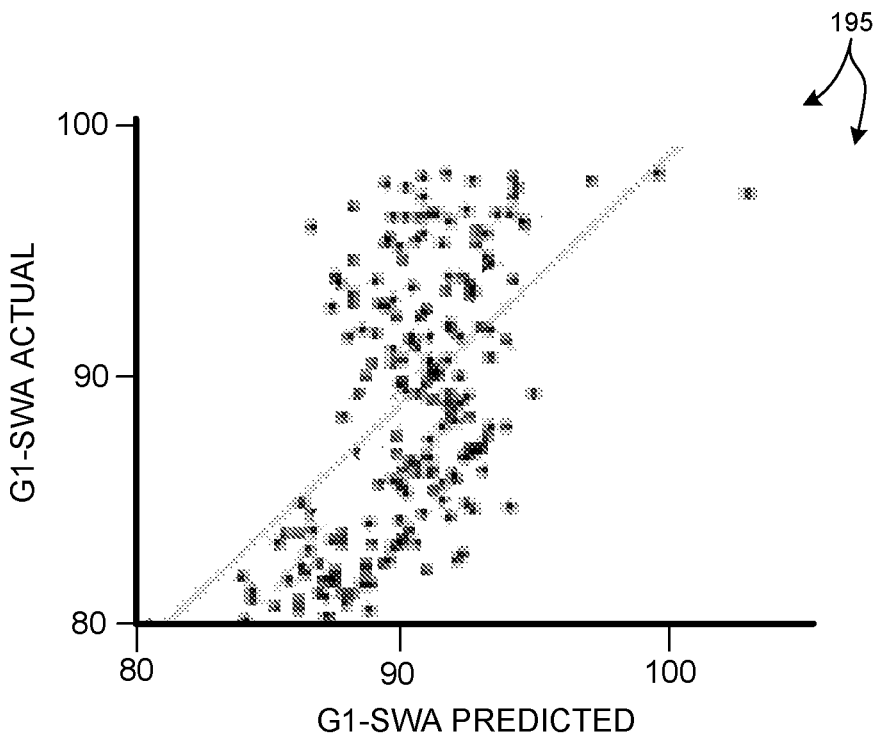
FIG. 10 illustrates a plot 195 depicting a simulation of the tracking performance of parameter, G1-SWA, depicted in FIG. 4, based on model-based measurement using a trained parameter isolation model.
Figure 11:
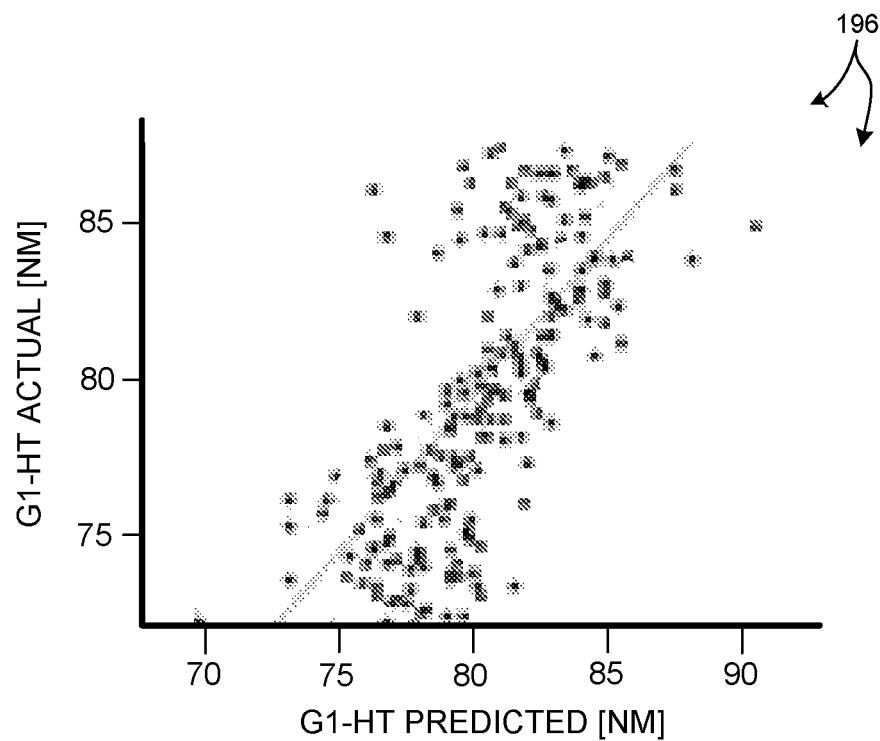
FIG. 11 illustrates a plot 196 depicting a simulation of the tracking performance of parameter, G1-HT, depicted in FIG. 4, based on model-based measurement using a trained parameter isolation model.
Figure 12:
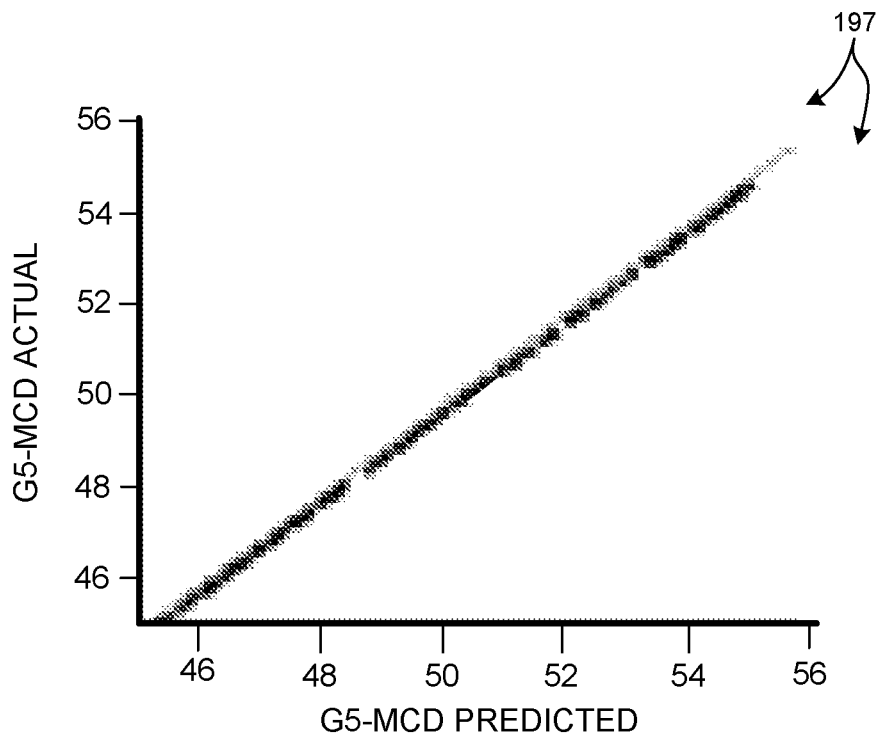
FIG. 12 illustrates a plot 197 depicting a simulation of the tracking performance of parameter, G5-MCD, depicted in FIG. 4, based on model-based measurement using a trained parameter isolation model.

FIG. 4 depicts a structure 180 under measurement, for example, by metrology system 100. Structure 180 includes a layer 181 having a trapezoidal structure 182, intervening layers 183, 184, and 185, and another trapezoidal structure 186 disposed on top of structure 180. Trapezoidal structure 182 is parameterized with a middle critical dimension parameter (G1-MCD), a sidewall angle parameter (G1-SWA), and a height parameter (G1-HT). Trapezoidal structure 186 is parameterized with a middle critical dimension parameter (G5-MCD), a sidewall angle parameter (G5-SWA), and a height parameter (G5-HT).

Computing system 130 generates reference raw signals 156 synthetically from a range of known parameter values for G1-MCD, G1-SWA, G1-HT, and G5-MCD. Similarly, computing system 130 generates reduced, reference raw signals 157 synthetically from the same range of known parameter values for G5-MCD, and fixed, nominal parameter values for G1-MCD, G1-SWA, and G1-HT.

FIGS. 5-8 illustrate tracking performance for each of the parameters, G1-MCD, G1-SWA, G1-HT, and G5-MCD, respectively. The tracking performance illustrated in FIGS. 5-8 is based on plotting actual, known values of each parameter against corresponding parameter values predicted based on conventional model-based metrology without using a parameter isolation model. As illustrated in plots 192, 193, 194, and 195, depicted in FIGS. 5-8, respectively, the tracking performance for each parameter is quite good. However, the computational effort associated with reaching this result is substantial. Note that in this example, only the reference raw signals 156 are provided to the model-based measurement engine. Also note that all parameters track well showing that the reference raw signals 156 include information associated with each of the parameters.

FIGS. 9-12 also illustrate tracking performance for each of the parameters, G1-MCD, G1-SWA, G1-HT, and G5-MCD, respectively. However, the tracking performance illustrated in FIGS. 9-12 is based on plotting actual, known values of each parameter against corresponding parameter values predicted based on model-based metrology using a parameter isolation model as described herein. In this example, the parameter G5-MCD is the parameter of interest and the parameters G1-MCD, G1-SWA, and G1-HT are incidental parameters. As illustrated in plots 194, 195, 196, and 197, depicted in FIGS. 9-12, respectively, the tracking performance for the incidental parameters is quite poor. However, the tracking performance for the parameter of interest, G5-MCD, is quite good. In this example, the computational effort associated with reaching this result is substantially less than conventional model-based metrology depicted in FIGS. 5-8. Note that in this example, the model-based measurement engine operates reduced measurement signals. Also note that all the parameter of interest (G5-MCD) continues to track well showing that the reduced measurement signals include information associated with the parameter of interest. However, the incidental parameters do not track well, showing that the reduced measurement signals lack information associated with the incidental parameters (G1-MCD, G1-SWA, and G1-HT). Thus, the parameter isolation model has effectively removed information associated with G1-MCD, G1-SWA, and G1-HT, from the measured signals.

In a further aspect, a parameter isolation model is trained and utilized to measure each parameter of interest individually. Thus, the parameter isolation model associated with each parameter of interest is optimized independently. In one example, reference raw measurement data may be collected for a number of different parameters as discussed with respect to FIGS. 5-12, and each parameter may be individually selected as the parameter of interest, while the remaining parameters are treated as incidental parameters for purposes of training a different parameter isolation model associated with each different parameter. By selecting each parameter of interest individually, the computational burden associated with parameter isolation model training is reduced and the performance of the underlying measurement can be maximized by selecting different wavelengths, measurement subsystems, and measurement methods that are optimized for each individual parameter. In addition, different model-based measurement solvers can be selected, or configured differently, for each parameter of interest.

In another further aspect, a parameter isolation model is trained and utilized to measure multiple parameters of interest in parallel. Thus, a single parameter isolation model is trained to isolate signals associated multiple parameters of interest. In one example, reference raw measurement data may be collected for a number of different parameters as discussed with respect to FIGS. 5-12, and multiple parameters may be selected as parameters of interest, while the remaining parameters are treated as incidental parameters for purposes of training a parameter isolation model associated with the multiple parameters of interest.

Typically, measurements of parameters of interest performed at a particular measurement site rely on data collected from that particular measurement site only, even though data may be collected from multiple sites on the wafer. For example, model-based measurements, such as image-based overlay, scatterometry overlay, etc., use only a subset of the available measurement data for model based regression. Thus, information from multiple sites that may improve measurement performance is not used.

In another aspect, the parameter isolation model uses the entire set of raw measurement data collected from a number of measurement sites across the wafer, or a subset of the wafer, for both training and subsequent measurement at each individual measurement site. As a result the parameter isolation model captures parameter variations across the wafer, including random process and measurement errors. For example, processes change randomly (e.g., random focus and dosage errors, etc.) and the parameter isolation models described herein are able to capture these errors.

Figure 13:
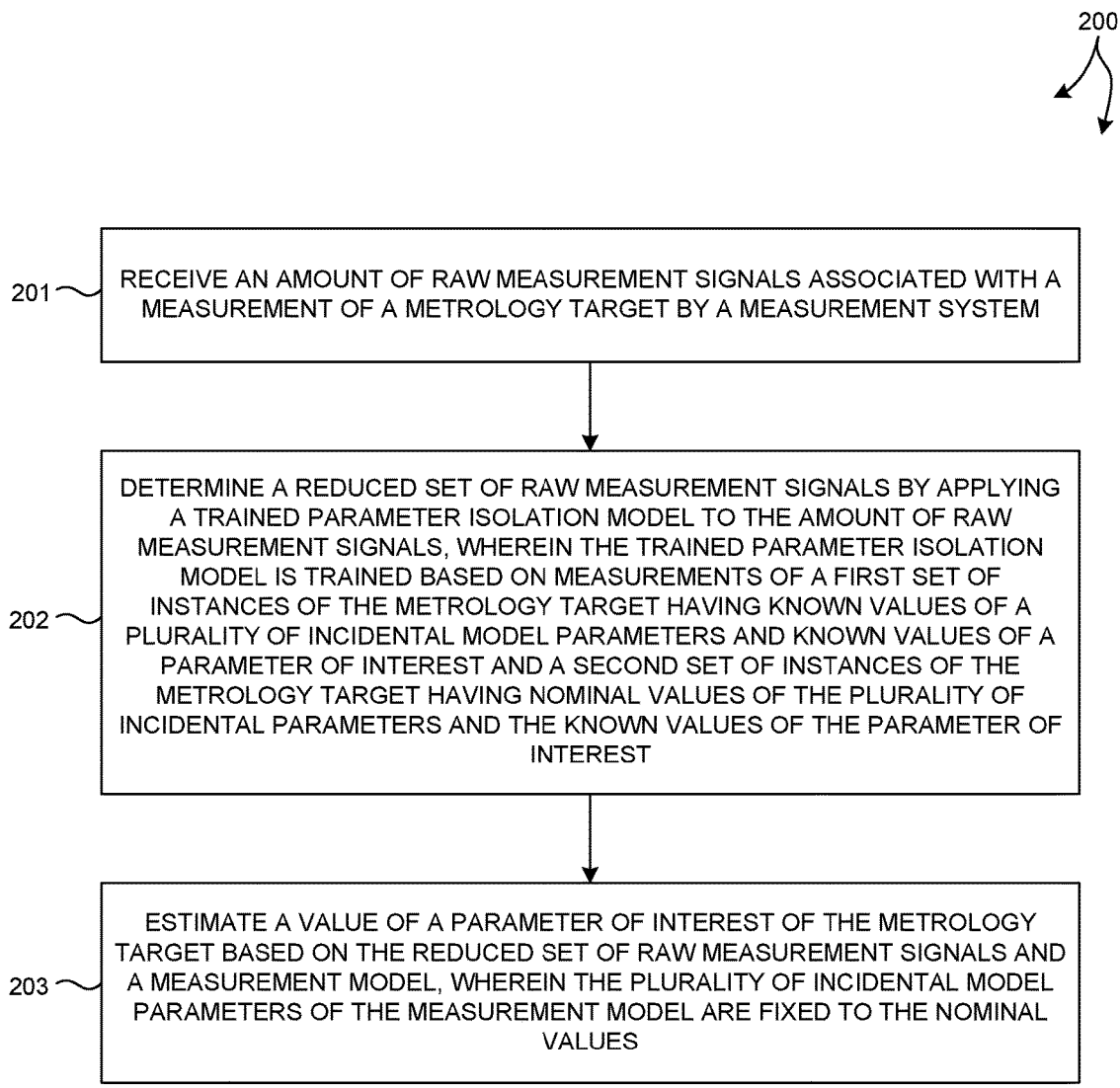
FIG. 13 illustrates a method 200 for performing measurements using a trained parameter isolation model.

FIG. 13 illustrates a method 200 for performing measurements using a trained parameter isolation model. Method 200 is suitable for implementation by a metrology system such as metrology system 100 illustrated in FIG. 1 of the present invention. In one aspect, it is recognized that data processing blocks of method 200 may be carried out via a pre-programmed algorithm executed by one or more processors of computing system 130, or any other general purpose computing system. It is recognized herein that the particular structural aspects of metrology system 100 do not represent limitations and should be interpreted as illustrative only.

In block 201, an amount of raw measurement signals associated with a measurement of a metrology target by a measurement system is received by computing system 130.

In block 202, a reduced set of raw measurement signals is determined by computing system 130. The reduced set of raw measurement signals is determined by applying a trained parameter isolation model to the amount of raw measurement signals. The trained parameter isolation model is trained based on measurements of a first set of instances of the metrology target having known values of a plurality of incidental model parameters and known values of a parameter of interest and a second set of instances of the metrology target having nominal values of the plurality of incidental parameters and the known values of the parameter of interest.

In block 203, a value of a parameter of interest of the metrology target is determined by computing system 130 based on the reduced set of raw measurement signals and a measurement model. The plurality of incidental model parameters of the measurement model are fixed to the nominal values during the determination of the value of the parameter of interest.

In addition, the determined values of the parameter of interest are stored in a memory. For example, the values may be stored on-board the measurement system 100, for example, in memory 132, or may be communicated (e.g., via output signal 140) to an external memory device (e.g., memory 123).

Figure 14:
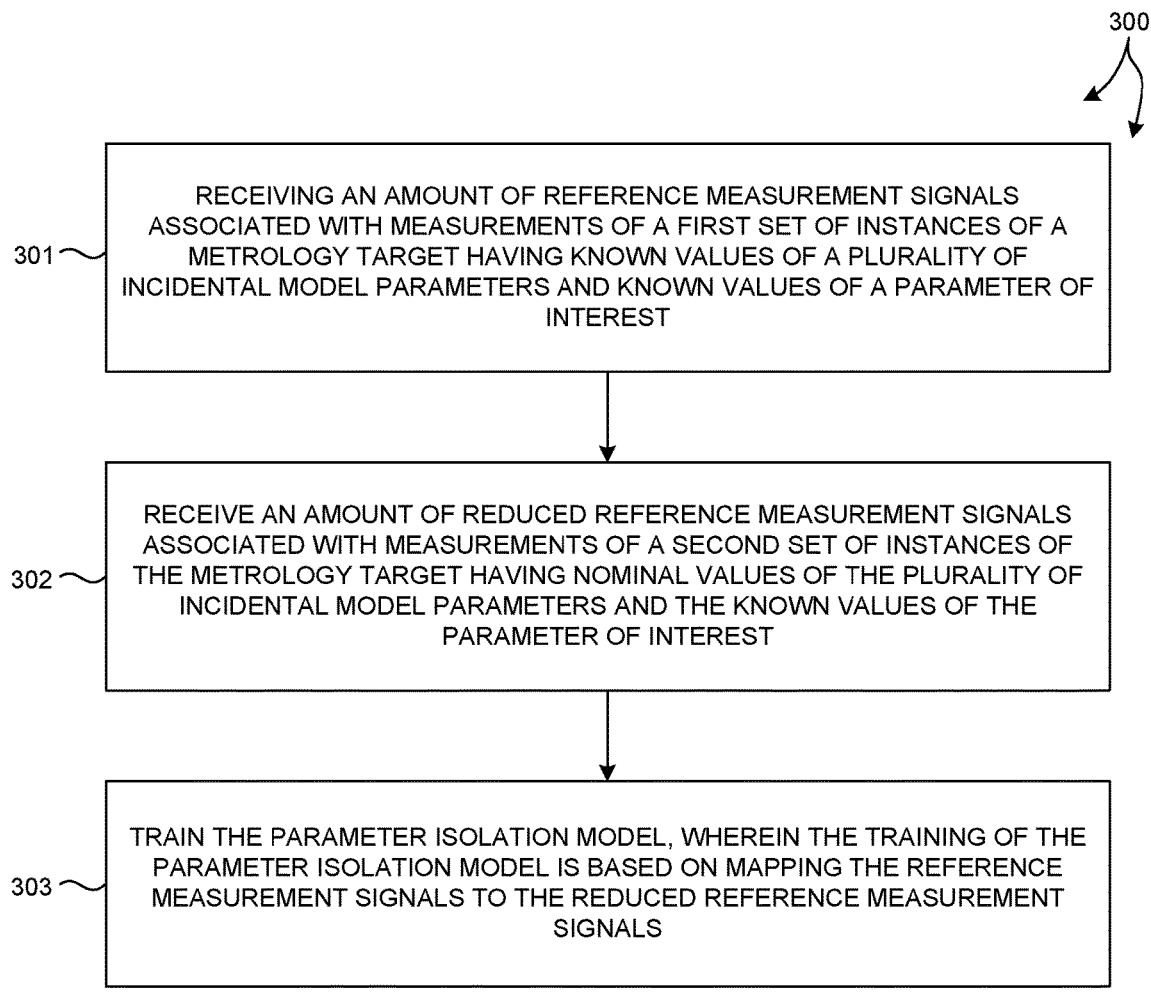
FIG. 14 illustrates a method 300 for training a parameter isolation model.

FIG. 14 illustrates a method 300 for training a parameter isolation model. Method 300 is suitable for implementation by a metrology system such as metrology system 100 illustrated in FIG. 1 of the present invention. In one aspect, it is recognized that data processing blocks of method 300 may be carried out via a pre-programmed algorithm executed by one or more processors of computing system 130, or any other general purpose computing system. It is recognized herein that the particular structural aspects of metrology system 100 do not represent limitations and should be interpreted as illustrative only.

In block 301, an amount of reference measurement signals are received by computing system 130. The reference measurement signals are associated with measurements of a first set of instances of a metrology target having known values of a plurality of incidental model parameters and known values of a parameter of interest.

In block 302, an amount of reduced reference measurement signals are received by computing system 130. The reduced reference measurement signals are associated with measurements of a second set of instances of the metrology target having nominal values of the plurality of incidental model parameters and the known values of the parameter of interest.

In block 303, the parameter isolation model is trained by computing system 130. The training of the parameter isolation model is based on mapping the reference measurement signals to the reduced reference measurement signals.

In general, the aforementioned measurement techniques may be applied to the measurement of process parameters, structural parameters, layout parameters, dispersion parameters, or any combination thereof. By way of non-limiting example, overlay, profile geometry parameters (e.g., critical dimension, height, sidewall angle), process parameters (e.g., lithography focus, and lithography dose), dispersion parameters, layout parameters (e.g., pitch walk, edge placement errors), film thickness, composition parameters, or any combination of parameters may be measured using the aforementioned techniques.

By way of non-limiting example, the structures measured with a trained parameter isolation model include line-space grating structures, FinFet structures, SRAM device structures, Flash memory structures, and DRAM memory structures.

In another further aspect, the metrology targets located on the wafer are preferably design rule targets. In other words, the metrology targets adhere to the design rules applicable to the underlying semiconductor manufacturing process. In some examples, the metrology targets are preferably located within the active die area. In some examples, the metrology targets have dimensions of 15 micrometers by 15 micrometers, or smaller. In this manner, the impact on overlay of intra-field variations induced by lithographic imperfections can be analyzed. In some other examples, the metrology targets are located in the scribe lines, or otherwise outside the active die area.

The trained parameter isolation models described herein receive raw measurement data, or signal components of raw measurement data, directly as input and provide reduced signals as output. By streamlining the measurement process, the predictive results are improved along with a reduction in computation and user time.

In another further aspect, the methods and systems for training the parameter isolation model include an optimization algorithm to automate any or all of the elements required to arrive at a trained parameter isolation model.

In some examples, an optimization algorithm is configured to maximize the performance of the parameter isolation model (defined by a cost function) by optimizing any or all of the following parameters: the type of model and the parameters of the selected model. The optimization algorithm can include user defined heuristics and can be combination of nested optimizations (e.g., combinatorial and continuous optimization).

In some embodiments, raw measurement data from multiple, different targets is collected for parameter isolation model building, training, and measurement. The use of data associated with multiple targets having different structure, but formed by the same process conditions increases the information embedded in the model and reduces the correlation to process or other parameter variations. The additional information embedded in the model allows for a decoupling of information content associated with one parameter of interest from information associated with other parameters (e.g., film thicknesses, CD, etc.) that may affect the measured signals in a similar manner. In these examples, the use of training data that includes measurements of multiple, different targets at one or more measurement sites enable more accurate signal isolation.

In general, any measurement technique, or combination of two or more measurement techniques may be contemplated within the scope of this patent document as the data processed for parameter isolation model training and measurement is in vector form. Because the model techniques as described herein operate on vectors of data, each collected signal is treated independently. In addition, it is possible to concatenate data from multiple, different metrologies, regardless of whether the data is two dimensional data, one dimensional data, or even single point data.

Exemplary measurement techniques that may provide data for analysis in accordance with the parameter isolation model techniques described herein include, but are not limited to spectroscopic ellipsometry, including Mueller matrix ellipsometry, spectroscopic reflectometry, including single wavelength, multiple wavelength, and angle resolved, spectroscopic scatterometry, scatterometry overlay, beam profile reflectometry, both angle-resolved and polarization-resolved, beam profile ellipsometry, single or multiple discrete wavelength ellipsometry, transmission small angle x-ray scatterometer (TSAXS), small angle x-ray scattering (SAXS), grazing incidence small angle x-ray scattering (GISAXS), wide angle x-ray scattering (WAXS), x-ray reflectivity (XRR), x-ray diffraction (XRD), grazing incidence x-ray diffraction (GIXRD), high resolution x-ray diffraction (HRXRD), x-ray photoelectron spectroscopy (XPS), raman spectroscopy, x-ray fluorescence (XRF), grazing incidence x-ray fluorescence (GIXRF), x-ray tomography, and x-ray ellipsometry. In general, any metrology technique applicable to the characterization of semiconductor structures, including image based metrology techniques, speckle based scatterometers, scanning electron microscopy (SEM), tunneling electron microscopy (TEM), and atomic force microscopy (AFM), may be contemplated, individually, or in any combination.

In general, signals from multiple targets each measured by multiple metrology techniques increases the information content in the combined set of signals and reduces the correlation to process or other parameter variations.

In a further aspect, the methods and systems for training and measuring parameter isolation models as described hereinbefore are implemented in a differential mode. In such a scheme the metrology target measurements and any associated reference measurements are performed at two distinct steps in the processing flow. The differences in the measured signals at each distinct processing step are treated as training signals for training purposes and measurement signals for measurement purposes.

In one example, the same location points are used for metrology target measurements at a lithography step and a subsequent etch step. The difference signal between the lithography and etch steps allows for monitoring of process variability on a per point site basis even if the structure varies between points on the wafer (e.g., due to process steps or small positioning errors). Such differential metrology mode may be preferred for metrology of SRAM device area where variations of the measurement target are present between different fields on the wafer.

In some examples, variations of the measurement target arise from a deficiency in the periodicity of the measured structures, e.g., finite structure size or in situations where the otherwise periodic structure is insufficiently repeated within the measurement spot of the metrology system. In some examples, variations of the measurement target arise from a small spot size of the optical metrology system and measurement location placement errors of the metrology system.

In some examples, the differences between actual device parameter values before and after one or more etch steps may be used as an input to the closed loop control of the etch process.

In general, differential metrology allows for global (wafer), field (field average), or local (per site) results that can be used, for example, to set the target bias between two process monitoring steps (i.e., etch and lithography), provide per field correction, or provide high order correction (e.g., OVL or EPE control).

In some examples, the parameter isolation model building, training, and measurement methods described herein are implemented as an element of a SpectraShape® optical critical-dimension metrology system available from KLA-Tencor Corporation, Milpitas, Calif., USA. In this manner, the model is created and ready for use immediately after the required reference raw measurement data are collected by the system.

In some other examples, the parameter isolation model building and training methods described herein are implemented off-line, for example, by a computing system implementing AcuShape® software available from KLA-Tencor Corporation, Milpitas, Calif., USA. The resulting, trained model may be incorporated as an element of an AcuShape® library that is accessible by a metrology system performing measurements.

In yet another aspect, the measurement results obtained using a parameter isolation model described herein can be used to provide active feedback to a process tool (e.g., lithography tool, etch tool, deposition tool, etc.). For example, values of EPE or overlay error determined using the methods described herein can be communicated to a lithography tool to adjust the lithography system to achieve a desired output. In a similar way etch parameters (e.g., etch time, diffusivity, etc.) or deposition parameters (e.g., time, concentration, etc.) may be included in a measurement model to provide active feedback to etch tools or deposition tools, respectively. In some example, corrections to process parameters determined based on measured device parameter values may be communicated to a lithography tool, etch tool, or deposition tool.

In general, the systems and methods described herein may be implemented as part of the process of preparing a parameter isolation model for off-line or on-tool measurement.

As described herein, the term "critical dimension" includes any critical dimension of a structure (e.g., bottom critical dimension, middle critical dimension, top critical dimension, sidewall angle, grating height, etc.), a critical dimension between any two or more structures (e.g., distance between two structures), and a displacement between two or more structures (e.g., overlay displacement between overlaying grating structures, etc.). Structures may include three dimensional structures, patterned structures, overlay structures, etc.

As described herein, the term "critical dimension application" or "critical dimension measurement application" includes any critical dimension measurement.

As described herein, the term "metrology system" includes any system employed at least in part to characterize a specimen in any aspect, including measurement applications such as critical dimension metrology, overlay metrology, focus/dosage metrology, and composition metrology. However, such terms of art do not limit the scope of the term "metrology system" as described herein. In addition, the metrology system 100 may be configured for measurement of patterned wafers and/or unpatterned wafers. The metrology system may be configured as a LED inspection tool, edge inspection tool, backside inspection tool, macro-inspection tool, or multi-mode inspection tool (involving data from one or more platforms simultaneously), and any other metrology or inspection tool that benefits from the calibration of system parameters based on critical dimension data.

Various embodiments are described herein for a semiconductor processing system (e.g., an inspection system or a lithography system) that may be used for processing a specimen. The term "specimen" is used herein to refer to a wafer, a reticle, or any other sample that may be processed (e.g., printed or inspected for defects) by means known in the art.

As used herein, the term "wafer" generally refers to substrates formed of a semiconductor or non-semiconductor material. Examples include, but are not limited to, monocrystalline silicon, gallium arsenide, and indium phosphide. Such substrates may be commonly found and/or processed in semiconductor fabrication facilities. In some cases, a wafer may include only the substrate (i.e., bare wafer). Alternatively, a wafer may include one or more layers of different materials formed upon a substrate. One or more layers formed on a wafer may be "patterned" or "unpatterned." For example, a wafer may include a plurality of dies having repeatable pattern features.

A "reticle" may be a reticle at any stage of a reticle fabrication process, or a completed reticle that may or may not be released for use in a semiconductor fabrication facility. A reticle, or a "mask," is generally defined as a substantially transparent substrate having substantially opaque regions formed thereon and configured in a pattern. The substrate may include, for example, a glass material such as amorphous $SiO_2$. A reticle may be disposed above a resist-covered wafer during an exposure step of a lithography process such that the pattern on the reticle may be transferred to the resist.

One or more layers formed on a wafer may be patterned or unpatterned. For example, a wafer may include a plurality of dies, each having repeatable pattern features. Formation and processing of such layers of material may ultimately result in completed devices. Many different types of devices may be formed on a wafer, and the term wafer as used herein is intended to encompass a wafer on which any type of device known in the art is being fabricated.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

Although certain specific embodiments are described above for instructional purposes, the teachings of this patent document have general applicability and are not limited to the specific embodiments described above. Accordingly, various modifications, adaptations, and combinations of various features of the described embodiments can be practiced without departing from the scope of the invention as set forth in the claims.

What is claimed is:

1. A measurement system comprising:
an illumination source configured to generate an amount of illumination radiation directed to a metrology target fabricated on a semiconductor wafer under measurement;
a detector configured to generate an amount of raw measurement signals from radiation collected from the semiconductor wafer in response to the amount of illumination radiation directed to the metrology target fabricated on the semiconductor wafer; and
a computing system configured to:
  receive the amount of raw measurement signals;
  determine a reduced set of raw measurement signals by applying a trained parameter isolation model to the amount of raw measurement signals, wherein the trained parameter isolation model is trained based on measurements of a first set of instances of the metrology target having known values of a plurality of incidental model parameters and known values of a parameter of interest and a second set of instances of the metrology target having nominal values of the plurality of incidental parameters and the known values of the parameter of interest;
  estimate a value of a parameter of interest of the metrology target based on the reduced set of raw measurement signals and a measurement model, wherein the plurality of incidental model parameters of the measurement model are fixed to the nominal values; and
  communicate an indication of the values of the parameter of interest to a semiconductor fabrication tool that causes the semiconductor fabrication tool to adjust one or more parameters of a fabrication process performed by the semiconductor fabrication tool to achieve a desired output from the semiconductor fabrication tool.

2. The measurement system of claim 1, wherein the computing system is further configured to:
receive an amount of reference measurement signals associated with the measurements of the first set of instances of the metrology target having known values of the plurality of incidental model parameters and the known values of the parameter of interest;
receive an amount of reduced reference measurement signals associated with the measurements of the second set of instances of the metrology target having nominal values of the plurality of incidental model parameters and the known values of the parameter of interest; and
train the parameter isolation model, wherein the training of the parameter isolation model is based on mapping the reference measurement signals to the reduced reference measurement signals.

3. The measurement system of claim 2, wherein the computing system is further configured to:
transform the reference measurement signals into a set of reference signal components, wherein the transforming of the reference measurement signals involves an input signal transformation model;
transform the reduced reference measurement signals into a set of reduced reference signal components, wherein the transforming of the reduced reference measurement signals involves a reference signal transformation model;
determine an inverse transformation model, wherein the inverse transformation model transforms the reduced reference signal components into the reduced reference measurement signals;

transform the amount of raw measurement signals into a first set of signal components, wherein the transforming of the amount of raw measurement signals involves the input signal transformation model, and wherein a second set of signal components is determined by applying the trained parameter isolation model to the first set of signal components; and transform the second set of signal components into the reduced set of raw measurement signals by applying the inverse transformation model to the second set of signal components.

4. The measurement system of claim 2, wherein the computing system is further configured to:
generate the reference measurement signals and the reduced reference measurement signals by simulation of the measurement model.

5. The measurement system of claim 3, wherein the input signal transformation model, the inverse transformation model, and the reference signal transformation model are determined based on a principle components analysis.

6. The measurement system of claim 3, wherein the input signal transformation model, the inverse transformation model, and the reference signal transformation model are model-based transformations trained on the reference measurement signals and the reduced reference measurement signals.

7. The measurement system of claim 1, wherein the parameter isolation model is any of a linear model, a non-linear model, a neural network model, a polynomial model, a response surface model, and a support vector machines model.

8. The measurement system of claim 1, wherein the estimating of the value of the parameter of interest involves any of a model-based regression, a model-based library search, a model-based library regression, image-based analysis, and a signal response metrology model.

9. The measurement system of claim 1, wherein the parameter of interest is any of a lithography focus parameter, a lithography dosage parameter, a critical dimension parameter, an overlay parameter, a film thickness parameter, and a material composition parameter.

10. A method comprising:
illuminating a metrology target fabricated on a semiconductor wafer under measurement with an amount of illumination radiation generated by an illumination source;
generating an amount of raw measurement signals from radiation collected from the semiconductor wafer in response to the amount of illumination radiation illuminating the metrology target fabricated on the semiconductor wafer;
determining a reduced set of raw measurement signals by applying a trained parameter isolation model to the amount of raw measurement signals, wherein the trained parameter isolation model is trained based on measurements of a first set of instances of the metrology target having known values of a plurality of incidental model parameters and known values of a parameter of interest and a second set of instances of the metrology target having nominal values of the plurality of incidental parameters and the known values of the parameter of interest;
estimating a value of a parameter of interest of the metrology target based on the reduced set of raw measurement signals and a measurement model, wherein the plurality of incidental model parameters of the measurement model are fixed to the nominal values; and
communicating an indication of the values of the parameter of interest to a semiconductor fabrication tool that causes the semiconductor fabrication tool to adjust one or more parameters of a fabrication process performed by the semiconductor fabrication tool to achieve a desired output from the semiconductor fabrication tool.

11. The method of claim 10, further comprising:
receiving an amount of reference measurement signals associated with the measurements of the first set of instances of the metrology target having known values of the plurality of incidental model parameters and the known values of the parameter of interest;
receiving an amount of reduced reference measurement signals associated with the measurements of the second set of instances of the metrology target having nominal values of the plurality of incidental model parameters and the known values of the parameter of interest; and
training the parameter isolation model, wherein the training of the parameter isolation model is based on mapping the reference measurement signals to the reduced reference measurement signals.

12. The method of claim 11, further comprising:
transforming the reference measurement signals into a set of reference signal components, wherein the transforming of the reference measurement signals involves an input signal transformation model;
transforming the reduced reference measurement signals into a set of reduced reference signal components, wherein the transforming of the reduced reference measurement signals involves a reference signal transformation model;
determining an inverse transformation model, wherein the inverse transformation model transforms the reduced reference signal components into the reduced reference measurement signals;
transforming the amount of raw measurement signals into a first set of signal components, wherein the transforming of the amount of raw measurement signals involves the input signal transformation model, and wherein a second set of signal components is determined by applying the trained parameter isolation model to the first set of signal components; and
transforming the second set of signal components into the reduced set of raw measurement signals by applying the inverse transformation model to the second set of signal components.

13. The method of claim 11, further comprising:
generating the reference measurement signals and the reduced reference measurement signals by simulation of the measurement model.

14. The method of claim 12, wherein the input signal transformation model, the inverse transformation model, and the reference signal transformation model are linear transformations.

15. The method of claim 12, wherein the input signal transformation model, the inverse transformation model, and the reference signal transformation model are model-based transformations trained on the reference measurement signals and the reduced reference measurement signals.

16. The method of claim 10, wherein the parameter isolation model is any of a linear model, a non-linear model, a neural network model, a polynomial model, a response surface model, and a support vector machines model.

17. The method of claim 10, wherein the estimating of the value of the parameter of interest involves any of a model-based regression, a model-based library search, a model-based library regression, image-based analysis, and a signal response metrology model.

18. The method of claim 10, wherein the parameter of interest is any of a lithography focus parameter, a lithography dosage parameter, a critical dimension parameter, an overlay parameter, a film thickness parameter, and a material composition parameter.

19. A method comprising:
  receiving an amount of reference measurement signals associated with measurements of a first set of instances of a metrology target having known values of a plurality of incidental model parameters and known values of a parameter of interest, wherein the measurements of the first set of instances of the metrology target are simulated by a measurement model;
  receiving an amount of reduced reference measurement signals associated with measurements of a second set of instances of the metrology target having nominal values of the plurality of incidental model parameters and the known values of the parameter of interest, wherein the measurements of the second set of instances of the metrology target are simulated by the measurement model;
  training a parameter isolation model, wherein the training of the parameter isolation model is based on mapping the reference measurement signals to the reduced reference measurement signals;
  illuminating a third instance of the metrology target fabricated on a semiconductor wafer under measurement with an amount of illumination radiation generated by an illumination source;
  generating an amount of raw measurement signals from radiation collected from the semiconductor wafer in response to the amount of illumination radiation illuminating the third instance of the metrology target fabricated on the semiconductor wafer;
  determining a reduced set of raw measurement signals by applying the trained parameter isolation model to the amount of raw measurement signals;
  estimating a value of a parameter of interest of the third instance of the metrology target based on the reduced set of raw measurement signals and a measurement model, wherein the plurality of incidental model parameters of the measurement model are fixed to the nominal values; and
  communicating an indication of the values of the parameter of interest to a semiconductor fabrication tool that causes the semiconductor fabrication tool to adjust one or more parameters of a fabrication process performed by the semiconductor fabrication tool to achieve a desired output from the semiconductor fabrication tool.

* * * * *